United States Patent [19]

Novak et al.

[11] 4,183,042

[45] Jan. 8, 1980

[54] POWER SEMICONDUCTOR DEVICE

[76] Inventors: Petr Novák, No. 1565 Hvezdova, Praha 4; Jaroslav Pellant, No. 4 Legerova, Praha 2; Jaroslav Zůna, No. 10 Kmochova, Praha 5; Jindřich Kratina, No. 604 Klanovicka, Praha 9; Pavel Reichel, No. 14 Lopatecka, Praha 4; Pavel Kafuněk, No. 19 Sarajevska, Prague 2, all of Czechoslovakia

[21] Appl. No.: 876,835

[22] Filed: Feb. 10, 1978

[30] Foreign Application Priority Data

Feb. 18, 1977 [CS] Czechoslovakia ............ 1088-77

[51] Int. Cl.² ........................................... H01L 25/04
[52] U.S. Cl. ............................................ 357/82; 357/68
[58] Field of Search ..................................... 357/82, 68

[56] References Cited

U.S. PATENT DOCUMENTS

| | | | |
|---|---|---|---|
| 3,978,518 | 8/1976 | Kessler et al. | 357/82 |
| 4,028,723 | 6/1977 | Shikano et al. | 357/82 |

Primary Examiner—Edward J. Wojciechowicz

[57] ABSTRACT

A power semiconductor device for efficient heat dissipation. The construction eliminates a loose contact between the semiconductor element and a cooling jig.

8 Claims, 3 Drawing Figures

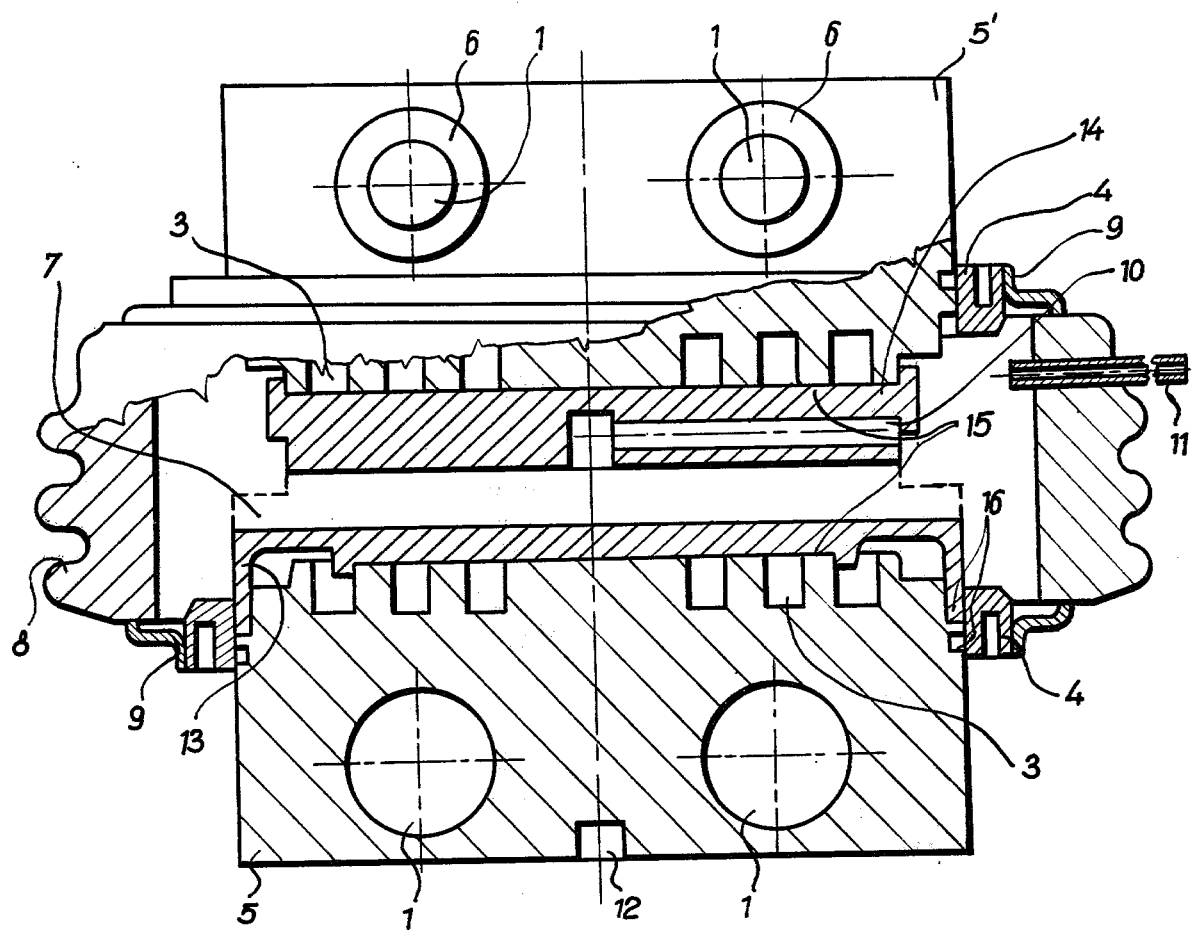

POWER SEMICONDUCTOR DEVICE

BACKGROUND OF THE INVENTION

1. Field of the Invention

This invention relates to a power semiconductor device having a semiconductor element located between two main electrodes.

2. Description of the Prior Art

Power semiconductor devices are presently predominantly produced having a semiconductor element pressed between two electrodes and the element forming a sliding contact with the electrodes. For providing a dissipation of the heat generated by the semiconductor system members are attached to the outer surfaces for heat removal. If necessary a cooling liquid such as water, oil and the like can circulate through the members providing for the removal of the heat generated.

The heat transmission resistance of the described semiconductor devices at the contact surface between the electrode block and the member for providing for heat removal does not sink below a certain value, since there is only a limited improvement possible for a sliding contact heat transfer mechanism as provided if an electrode block is pressed against a member for removal of the heat. This results in turn in a limit for the power going through or being controlled by the semiconductor device. In summary, the presence of the pressed contact area results in an impairment of the heat removal from the semiconductor element of its internally generated heat. Therefore it is desirable to remove this contact surface of the electrode and of the cooling member for obtaining a higher rating of the semiconductor device.

Constructions of power transistor devices have been described which eliminate in principle the pressure contact surface. These devices have electrode blocks with suitable hollow spaces in suitable geometric layouts, e.g. with protrusions, pins and the like which serve to provide a circulation path of the cooling fluid. The hollow spaces are sealed with elastic elements and are closed with a cap. However these constructions are complicated and expensive to manufacture and they comprise a larger number of components and furthermore their reliability is not as good as desired.

SUMMARY OF THE INVENTION

1. Purposes of the Invention

It is an object of the invention to provide a power semiconductor device comprising an efficient cooling circuit. It is another object of the invention to provide a power semiconductor device with a relatively high rating by providing an efficient path for the removal of the heat internally generated.

It is another object of the invention to provide a power semiconductor device having less volume than conventional comparable devices. These and other objects and advantages of the present invention will become evident from the description which follows.

2. Brief Description of the Invention

A power semiconductor device is disclosed which comprises a semiconductor junction section having attached two first electrode parts with their inner sides to opposite sides of the semiconductor junction section. Two second electrode parts are in turn attached to the outer sides of the respective first electrode parts and each of the second electrode parts comprises a system of cavities. An insulating collar is provided for mechanically connecting the two second electrode parts.

The invention accordingly consists in the features of construction combination of elements and arrangement of parts which will be exemplified in the device hereinafter described and of which the scope of application will be indicated in the appended claims.

BRIEF DESCRIPTION OF THE DRAWING

In the accompanying drawing in which is shown one of the various possible embodiments of the invention:

FIG. 1 is a partially sectional elevation view of a power semiconductor device;

DETAILED DESCRIPTION OF THE PREFERRED EMBODIMENTS

Figure 2:
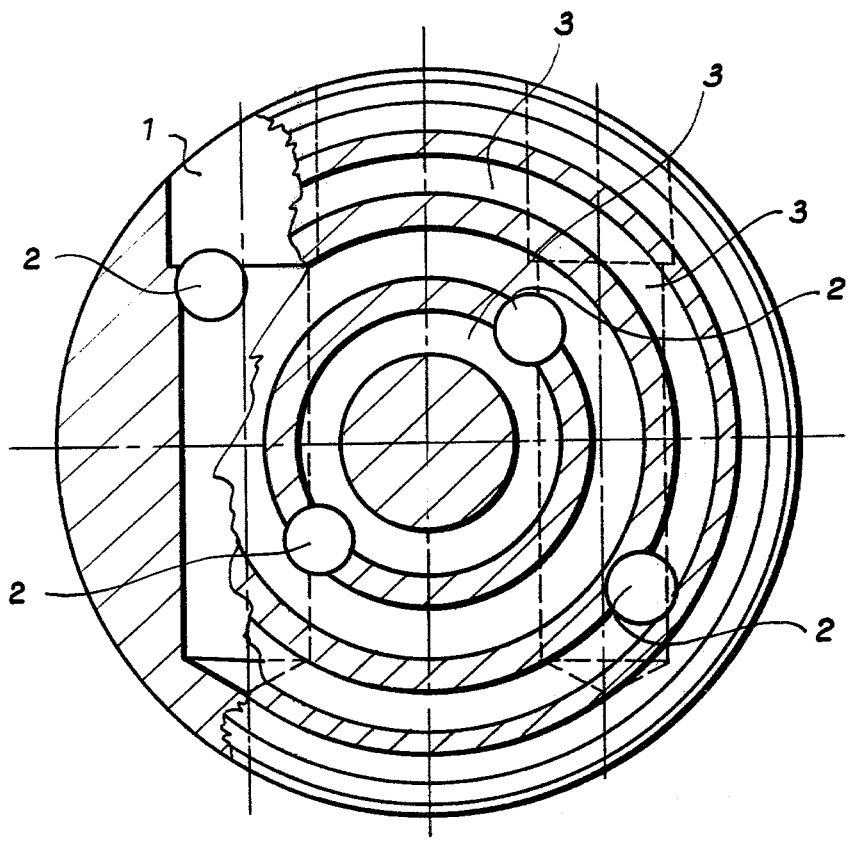
FIG. 2 is a section plan view taken along each of lines A of FIG. 2 and showing a cross-section of the cooling member.
Figure 3:
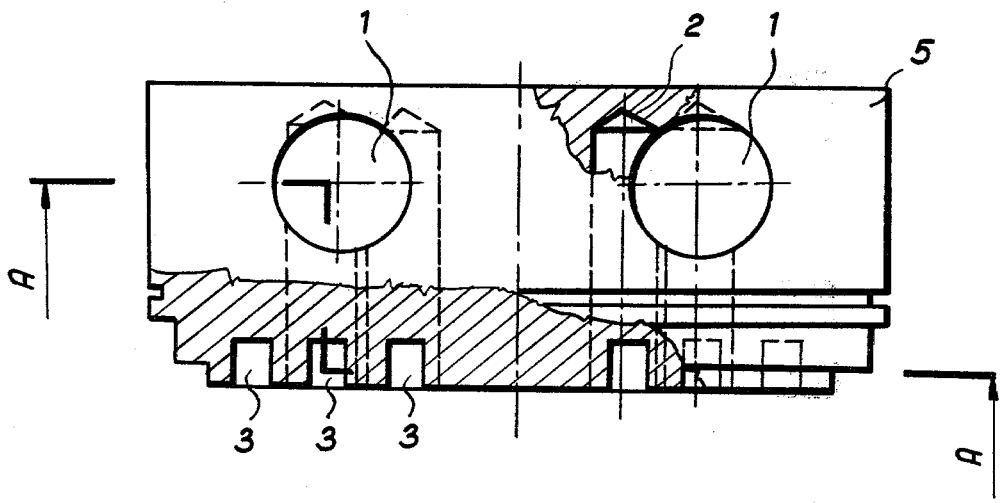
FIG. 3 is a sectional elevation view of the cooling member in FIG. 1.

The power semiconductor device of the present invention solves the above stated disadvantages of the prior art by providing a tight and hermetical joining of main electrodes and of cooling members. A first part of the cooling member adjoining to an electrode is formed by a circular disc and a second part of the cooling member adjoins the first part and incorporates a system of hollow spaces and cavities for circulation of a cooling fluid. The two second parts of the cooling member are mutually connected with an insulating ring.

The hollow spaces and cavities of the second part of the cooling member are located in two parallel planes, which in turn are coplanar with the plane of the semiconductor system. The hollow spaces adjacent to the outer side of the first part form a series of concentric channels and the hollow spaces on the outer side of the second part are formed by two essentially parallel cylindrical channels. The concentric channels and the parallel cylindrical channels are connected by at least two connection channels or conduits. The circumference of the second part comprises a protrusion or shoulder which is undetachably joined to a mounting of the insulating ring. One of the first parts is provided with a hollow space or conduit for placing a connection for a control, gate or base electrode or its pressure connection system. The cylindrical channels of the second part are provided with fittings for inflow and outflow of the cooling fluid.

The power semiconductor device of the present invention represents a new and improved semiconductor device wherein the contact surface between electrodes and cooling members is eliminated. The construction of the device allows to employ simple production techniques and to use to a maximum conventional and developed techniques resulting in increased reliability and in economic benefits.

Referring now to FIG. 1, there is shown an embodiment of the power semiconductor device. A semiconductor system 7 is located between two main electrodes of the device in a sliding contact as is shown in the partially sectional elevation view of FIG. 1. The semiconductor system 7 is formed by a silicon disc with at least one pn-junction. The disc may be accompanied by a stiffening plate of molybdenum or tungsten. The main electrodes of the power semiconductor device comprise two tightly and hermetically joined parts 13 and 14, and 5 and 5', respectively, wherein the first part 13 and 14, respectively, is formed by a circular disc and adjoins the semiconductor system 7. The second part 5 and 5', respectively, comprises a system of cavities and hollow spaces 1, 2 and 3.

The second parts 5 and 5', respectively of the two main electrodes of the semiconductor device have along their circumference a shoulder 4 for undetachably joining the mounting 9 of the ceramic insulating ring 8, e.g. the protrusion 4 can be brazed or welded to the mounting 9.

The protrusion 4 running along the circumference can form part of a ring slid over the outer circumference of the second part 5 and 5', respectively, of the main electrode and can finally be welded with layer 16.

Alternatively, the shoulder 4 can be an integral part of the second part 5 and 5', respectively of the main electrode.

The ceramic insulating ring 8 can be provided with a passage tube 11 for connecting a gate or base electrode if the power semiconductor device is a thyristor or a triac or possibly a transistor. Then the first part 14 of the main electrode comprises a hollow space or conduit 10 for providing a gate or base electrode connection or a pressure contact for the gate electrode.

Referring now to FIG. 2 there are shown details of the cavities and hollow spaces of the second parts 5 and 5', respectively. The hollow spaces are arranged in two planes parallel to the plane of the semiconductor system disc 7 and the spaces in the two planes are connected by connecting channels 2. The hollow spaces adjacent to the outer sides of the first parts 13 and 14, respectively, of the main electrodes are formed by a series of concentric channels 3. The hollow spaces on the opposite side of the second part 5 and 5', respectively of the main electrodes, are formed by two essentially parallel cylindrical channels 1. These channels 1 are provided with fittings 6 as shown in FIG. 1 serving as ports for inflow and outflow of cooling fluid. A cooling fluid can be a liquid, e.g. water, oil. The two parts 13 and 14, respectively, and 5 and 5', respectively, of the main electrodes are mutually tight and hermetically joined, e.g. by a soldering or brazing layer 15 shown in FIG. 1 as a stronger trace. The second parts 5 and 5', respectively, of the main electrodes can be provided with centering openings 12 on their outside for proper positioning and mounting of the power semiconductor device in the direction of compression.

The construction of the power semiconductor device of the present invention allows an increase of the power. The improved removal of the heat generated in the device increases considerably the power rating of the semiconductor device and expands the range of application possibilities. Compared with the volume of the conventional concept of a separate device and of a separate cooling member, the small volume of the power semiconductor device of the present invention leads to advantages and economies relating both to the production of the device and to energy savings in its operation.

It thus will be seen that there is provided a device which achieves the various objects of the invention and which is well adapted to meet the conditions of practical use.

From the above, it will be understood that the foregoing description is merely illustrative of preferred embodiments and specific examples of the present invention, and that variations may be made in such embodiments and examples by those skilled in the art without departing from the spirit and purview thereof.

What is claimed is:

1. A power semiconductor device comprising:
   a semiconductor junction section;
   two first electrode parts having their inner sides attached to opposite sides of the semiconductor junction section;
   two second electrode parts attached to the outer sides of the respective first electrode part and each second electrode part defining a system of hollow spaces therein, said system of hollow spaces of the second parts have first passages disposed in a first plane and second passages disposed in a second plane, said first and second planes being parallel to said semiconductor junction section and are provided with an inlet and outlet port, at least one third passage connecting said first and second passages; and
   an insulating collar mechanically connecting the two electrode parts to each other.

2. The power semiconductor device as set forth in claim 1, wherein the first electrode parts are of circular disc shape.

3. The power semiconductor device as set forth in claim 2, wherein one plane of hollow spaces in the second part is covered by the corresponding first part.

4. The power semiconductor device as set forth in claim 3, wherein the one plane of hollow spaces forms a plurality of concentric channels in the second part and each channel being connected to the inlet and the outlet port.

5. The power semiconductor device as set forth in claim 3, wherein the concentric channels are connected by two or more connecting conduits to two respective ports.

6. The power semiconductor device as set forth in claim 5, comprising:
   a fitting attached to the insulating ring; and
   a shoulder around the circumference of the second part rigidly connected to the fitting.

7. The power semiconductor device as set forth in claim 5, wherein the respective first and second parts are circular and the second parts respectively have fittings for the inflow and outflow of a cooling fluid.

8. The power semiconductor device as set forth in claim 1, wherein one of the first parts comprises:
   a hollow conduit for providing a connection for a control electrode or for its contact system.

* * * * *